(12) United States Patent  
Li et al.

(10) Patent No.: US 8,367,494 B2
(45) Date of Patent: Feb. 5, 2013

(54) ELECTRICAL FUSE FORMED BY REPLACEMENT METAL GATE PROCESS

(75) Inventors: Ying Li, Newburgh, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/080,019

(22) Filed: Apr. 5, 2011

(65) Prior Publication Data

US 2012/0256267 A1 Oct. 11, 2012

(51) Int. Cl.  
*H01L 21/8238* (2006.01)

(52) U.S. Cl. ........ 438/215; 438/199; 438/200; 438/210; 438/218; 438/238; 438/601

(58) Field of Classification Search .................. 438/199, 438/200, 210, 215, 218, 238, 601  
See application file for complete search history.

(56) References Cited

U.S. PATENT DOCUMENTS

| 5,966,597 | A | 10/1999 | Wright |
| 6,927,473 | B2 | 8/2005 | Wang et al. |
| 2003/0132504 | A1 | 7/2003 | Bertin et al. |
| 2009/0101989 | A1 | 4/2009 | Chen et al. |
| 2010/0059823 | A1* | 3/2010 | Chung et al. ................. 257/355 |
| 2010/0109049 | A1 | 5/2010 | Cheng et al. |
| 2010/0163949 | A1 | 7/2010 | Divakaruni et al. |
| 2010/0237435 | A1* | 9/2010 | Chudzik et al. ............... 257/380 |
| 2011/0037128 | A1 | 2/2011 | Chakravarti et al. |
| 2011/0057267 | A1* | 3/2011 | Chuang et al. ................ 257/380 |
| 2011/0101460 | A1* | 5/2011 | Heinrich et al. ............... 257/355 |
| 2011/0147853 | A1* | 6/2011 | Lin et al. ...................... 257/379 |
| 2011/0169100 | A1* | 7/2011 | Shimizu et al. ............... 257/380 |
| 2011/0241086 | A1* | 10/2011 | Kurz et al. .................... 257/288 |
| 2011/0241117 | A1* | 10/2011 | Wei et al. ...................... 257/355 |
| 2012/0074475 | A1* | 3/2012 | Chew et al. .................... 257/295 |

* cited by examiner

*Primary Examiner* — Bac Au  
(74) *Attorney, Agent, or Firm* — Daryl K. Neff; H. Daniel Schnurmann (57) ABSTRACT

A method is provided for fabricating an electrical fuse and a field effect transistor having a metal gate which includes removing material from first and second openings in a dielectric region overlying a substrate, wherein the first opening is aligned with an active semiconductor region of the substrate, and the second opening is aligned with an isolation region of the substrate, and the active semiconductor region including a source region and a drain region adjacent edges of the first opening. An electrical fuse can be formed which has a fuse element filling the second opening, the fuse element being a monolithic region of a single conductive material being a metal or a conductive compound of a metal. A metal gate can be formed which extends within the first opening to define a field effect transistor ("FET") which includes the metal gate and the active semiconductor region.

18 Claims, 6 Drawing Sheets

ELECTRICAL FUSE FORMED BY REPLACEMENT METAL GATE PROCESS

BACKGROUND OF THE INVENTION

1. Field of the Invention

The subject matter of the present application relates to electrical fuses and their manufacture, and more specifically to a structure and method of making an electrical fuse with a replacement metal gate structure.

2. Description of the Related Art

Fuses have been widely used in integrated circuits to store permanent information on board such as the Electronic Chip Identification (ECID), key system boot code and other critical information in the form of One-Time Programmable Read Only Memory (OTPROM). They are also widely used for redundancy repairs in memories and various integrated circuits to improve manufacturing yield or circuit trimming to fine tune device performance in analog products.

Various types of electrically-blowable fuses have been proposed for use and used in microelectronic elements, i.e., semiconductor wafers, or portions thereof such as semiconductor chips incorporating integrated circuits. Such fuses are programmed, i.e., blown, from a conductive state to a non-conductive state by driving a programming current therethrough.

Future improvements can be made to the fabrication and structure of electrical fuses in accordance with the embodiments of the invention as further described herein.

SUMMARY OF THE INVENTION

According to an aspect of the invention, a method is provided for fabricating an electrical fuse and a field effect transistor having a metal gate which includes removing material from first and second openings in a dielectric region overlying a substrate, wherein the first opening is aligned with an active semiconductor region of the substrate, and the second opening is aligned with an isolation region of the substrate, and the active semiconductor region including a source region and a drain region adjacent edges of the first opening. An electrical fuse can be formed which has a fuse element filling the second opening, the fuse element being a monolithic region of a single conductive material being a metal or a conductive compound of a metal. A metal gate can be formed which extends within the first opening to define a field effect transistor ("FET") which includes the metal gate and the active semiconductor region.

In accordance with one embodiment, the step of forming the fuse element of the electrical fuse can include filing the first and second openings with the conductive material, then removing the conductive material from the first opening selectively relative to an interface layer overlying the active semiconductor region before forming the metal gate.

In accordance with an embodiment, the step of removing the material from the first and second openings can be performed simultaneously with respect to the first and second openings.

In one embodiment, a gate dielectric can be formed overlying the active semiconductor region after removing the conductive material from the first opening and prior to forming the metal gate.

In one embodiment, the forming of the gate dielectric can include repairing a dielectric layer exposed within the first opening.

In a particular embodiment, the conductive material of which the fuse element can consist essentially is titanium nitride. In a particular example, the titanium nitride material can be deposited by chemical vapor deposition.

In a particular example, the active semiconductor region can be a first active semiconductor region, and the step of removing material from the first and second openings can further include removing material from a third opening aligned with a second active semiconductor region. A source and a drain can be disposed in the second active semiconductor region adjacent respective edges of the third opening. In such method, a second metal gate can be formed which extends within the third opening to define a second FET which includes the second metal gate and the second active semiconductor region.

In a particular example when first and second FETs are formed, the first FET can be a p-type FET ("PFET"), the second FET can be an n-type FET ("NFET"), the first metal gate may have a first workfunction corresponding to a p-type FET ("PFET") and the second metal gate may have a second workfunction corresponding to an n-type FET ("NFET"), wherein the second workfunction may be different from the first workfunction.

Such method of forming first and second FETs may include removing the material simultaneously from the first, second and third openings, and the step of forming the fuse element can include filling the first, second and third openings with the conductive material, then removing the conductive material from the first and second openings selectively relative to an interface layer overlying the first and second active semiconductor regions before forming the first and second metal gates.

In a particular embodiment, an integrated circuit can be provided which includes an electrical fuse, and first and second field effect transistors ("FETs"). Such integrated circuit can include, for example, a dielectric region having first, second and third openings therein. The first opening can be aligned with a first active semiconductor region of a substrate. A second opening can be aligned with an isolation region extending into the substrate. A third opening can be aligned with a second active semiconductor region of the substrate, and the first and second active semiconductor regions may each include a source region and a drain region adjacent respective edges of the first and third openings, respectively. The electrical fuse may including a fuse element having a monolithic conductive region filling the second opening. The first FET can include a first metal gate extending within the first opening. The second FET can include a second metal gate extending within the third opening.

In a particular example of the integrated circuit, the first FET can be a p-type FET ("PFET"), the first metal gate can have has a workfunction corresponding to the PFET, the second FET can be a p-type FET ("NFET") and the second metal gate can have a workfunction corresponding to the NFET.

DETAILED DESCRIPTION

Figure 1:
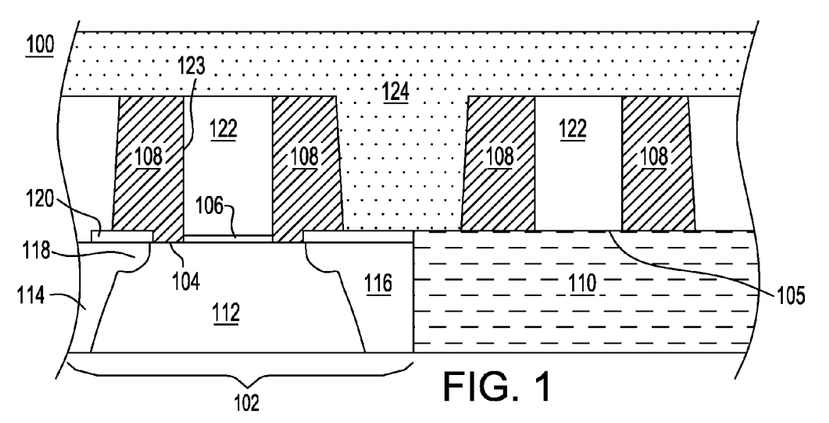
FIG. 1 is a sectional view illustrating a stage in a method of fabricating a FET and an electrical fuse according to an embodiment of the invention.

FIG. 1 illustrates a stage in a method of fabricating a field effect transistor and an electrical fuse in accordance with an embodiment of the invention. FIG. 1 depicts a starting structure 100 which can take the form of a substrate, e.g., a semiconductor wafer having an active semiconductor region 102 with a surface 104 at a major surface of the substrate. An isolation region 110, typically consisting essentially of an oxide, e.g., silicon dioxide, can be disposed laterally adjacent the active semiconductor region 102. The isolation region may have a surface 105 co-planar with the surface 104 of the active semiconductor region. Alternatively, the isolation region 110 may have a surface 105 projecting above the surface of the active semiconductor region 104.

An interface layer 106, typically of dielectric material, can be disposed atop the active semiconductor region 102 within an opening between dielectric spacers 108 of a dielectric region overlying the active semiconductor region. Typically, the interface layer 106 consists essentially of an oxide such as silicon dioxide. The active semiconductor region 102 may include differently doped regions. For example, as seen in FIG. 1, the active semiconductor region may include a body 112, and a source 114 and a drain 116 adjacent to the body.

The source and the drain may include additional features such as extension or halo regions 118 and metal silicide regions 120 disposed atop the source and the drain. In one example, the silicide regions can be formed by a self-aligned process of depositing a metal or a metal compound within the apertures in the dielectric region, heating the substrate to cause the metal or metal compound within the apertures to react with the semiconductor material of the semiconductor feature and the device regions, and then removing the unreacted metal from at least some portions of the substrate.

At this stage of fabrication, features 122 may be disposed between the spacers 108 in first and second openings. Thus, a feature 122 can be disposed within a first opening overlying an active semiconductor region 102 and another feature 122 can be disposed within a second opening overlying the isolation region 110. In one embodiment, the features 122 can consist essentially of polysilicon. The polysilicon features may have been used earlier in the formation of the spacers 108 and in processes which define the source and drains 114, 116. Although not shown, an additional feature similar to feature 122 can be disposed within yet another opening (not shown) between spacers similar to spacers 108, such opening overlying a second active semiconductor region (not shown). For example, as seen in the corresponding plan view of FIG. 12, a second active semiconductor region 103, like the first active semiconductor region 102, can have an area at the major surface which is bounded by an isolation region 110. As will be described more fully below, in one embodiment, the first active semiconductor region 102 can be for forming a p-type field effect transistor ("PFET") and the second active semiconductor region 103 can be for forming an n-type field effect transistor ("NFET").

Figure 2:
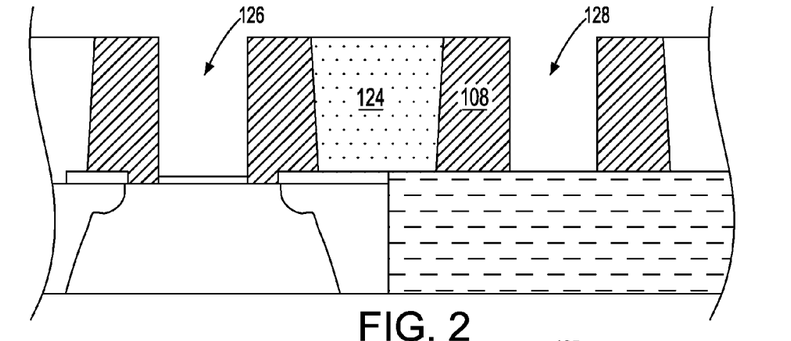
FIG. 2 is a sectional view illustrating a stage of fabrication subsequent to the stage shown in FIG. 1.

As further shown in FIG. 1, an oxide dielectric region 124 can be disposed between the spacers 108 and atop the features 122 and spacers 108. FIG. 2 shows a subsequent stage in which a portion of the oxide region 124 overlying the spacers 108 has been removed, such as by polishing the oxide region, e.g., by chemical mechanical polishing ("CMP"). The features 122 then can be removed from each of the first opening 126 and second opening 128, such as by etching performed selectively relative to the material of the spacers 108, to form the structure as seen in FIG. 2.

Figure 3:
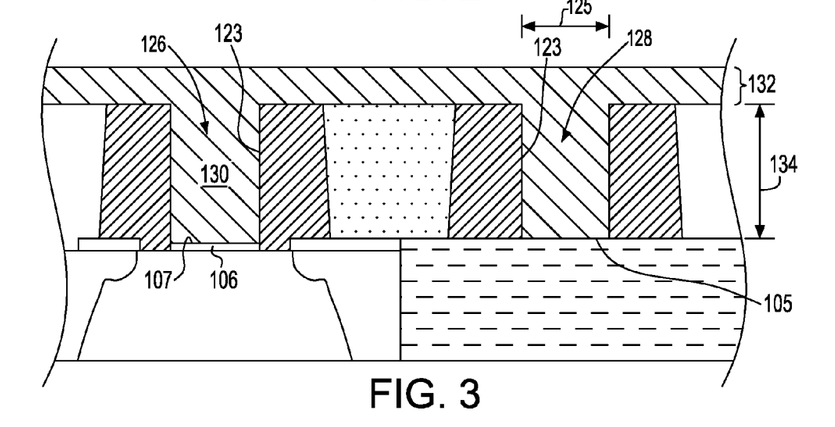
FIG. 3 is a sectional view illustrating a stage of fabrication subsequent to the stage shown in FIG. 2.

Next, as shown in FIG. 3, a monolithic conductive region 130 can be formed which fills the openings and may include portions 132 which overlie the spacers 108 and the oxide region 124. In one example, as deposited the monolithic conductive region 130 can be formed of a single conductive material such as a metal or a conductive compound of a metal which contacts interior surfaces of the openings 126, 128 including interior walls 123, surface 105, and a surface 107 of an interface layer 106. In a particular embodiment, the monolithic conductive region 130 can be or consist essentially of titanium nitride.

In another example, the monolithic conductive region 130 can include one or more layers of metal lining interior surfaces of the openings such as walls 123 and surfaces 105 and 107, and a second metal filling the remaining volumes within the openings. For example, the first metal layer can include one or more of an adhesion layer, seed layer or barrier metal layer, the first metal layer typically having very small thickness generally in the range of 5 to 50 angstroms in thickness. In a particular example, the second metal layer fills the remaining volume of the opening. In particular embodiments, the width 125 of the monolithic conductive region can be 15 to 50 nanometers and the height 134 of the spacers from the surface 105 may typically be 30 to 200 nanometers. With layers formed according to the above details, even when a first metal layer serves purposes such as an adhesion layer, seed layer or barrier metal layer, the monolithic conductive region 130 formed of a single conductive material takes up substantially all the interior volume within the second opening 128.

Figure 4:
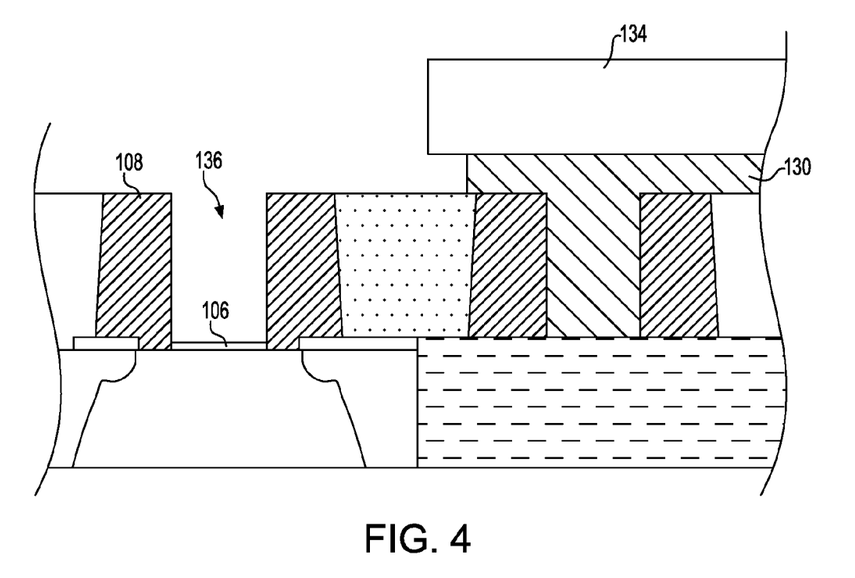
FIG. 4 is a sectional view illustrating a stage of fabrication subsequent to the stage shown in FIG. 3.
Figure 5:
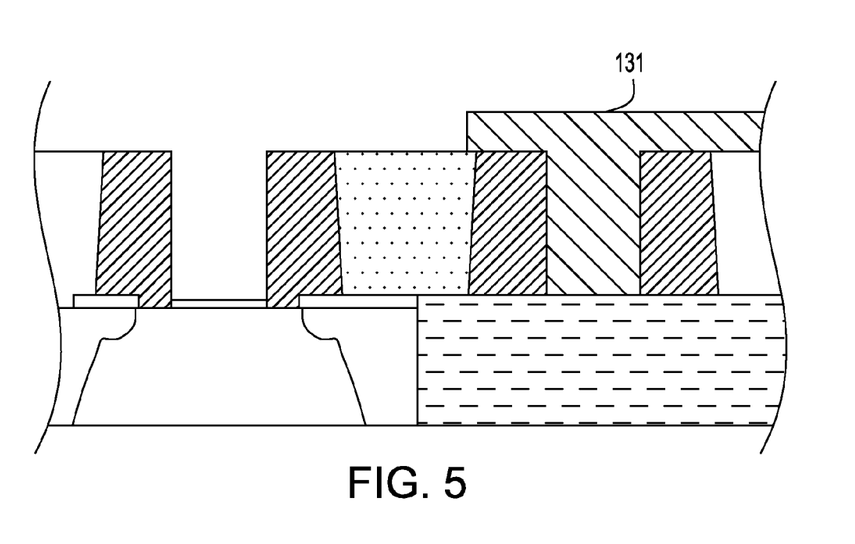
FIG. 5 is a sectional view illustrating a stage of fabrication subsequent to the stage shown in FIG. 4.

FIG. 4 illustrates a subsequent stage of fabrication in which a photoresist mask or "resist mask" 134 is formed atop a portion of the conductive region 130. Thereafter, a portion of the conductive region 130 in the first opening 126 which is exposed beyond an edge of the resist mask is selectively removed from the first opening 126. For example, the conductive region can be removed from the opening 126, such as by etching performed selectively relative to the material of the interface layer 106 and the spacers 108. The resist mask 134 then is removed to produce the structure as seen in FIG. 5, in which a surface 131 of the conductive region 130 can now be exposed.

Figure 6:
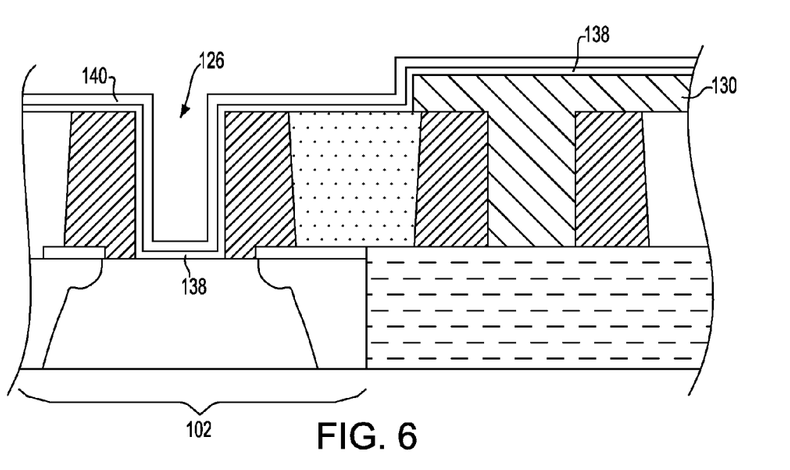
FIG. 6 is a sectional view illustrating a stage of fabrication subsequent to the stage shown in FIG. 5.

Thereafter, as seen in FIG. 6, a gate dielectric layer 138 can be formed within the first opening. In one example, the gate dielectric 138 can be formed by further processing an existing interface layer 106 (FIG. 4). Alternatively, the gate dielectric layer 138 can be formed by removing the interface layer 106 and forming a new gate dielectric layer 138 in its place. In a particular embodiment, the gate dielectric layer 138 can be a high dielectric constant gate dielectric layer, such as one having a dielectric constant greater than 5. In a particular embodiment, the gate dielectric layer 138 can include one or more of the following dielectric materials which have relatively high dielectric constants: hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Typically, such gate dielectric layer is deposited by chemical vapor deposition (CVD) or atomic layer deposition (ALD). As seen in FIG. 6, the gate dielectric layer 138 can be deposited to cover all exposed surfaces, such that the gate dielectric layer 138 at this stage may include a portion overlying the monolithic conductive region 130.

After forming the gate dielectric layer 138, a gate metal 140 can then be deposited onto the structure as a metal having a workfunction for forming a gate of a transistor which includes the first active semiconductor region. In one example, the transistor may be a field effect transistor having a p-type conductivity conduction channel, i.e., a "PFET". The gate metal 140 deposited adjacent the gate dielectric 138 in such case can have a workfunction which corresponds to the workfunction needed for the PFET.

Figure 7:
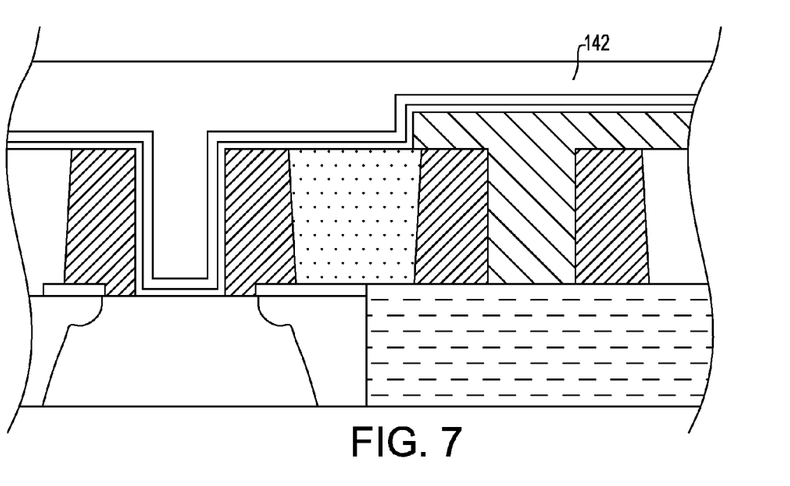
FIG. 7 is a sectional view illustrating a stage of fabrication subsequent to the stage shown in FIG. 6.

Thereafter, as seen in FIG. 7, a further resist mask 142 can be formed within the opening 126 and atop the conductive region 130. At that time, a portion of the gate metal 140 which lies within an opening (not shown) overlying the second active semiconductor region 103 (FIG. 12) can be exposed beyond an edge (not shown) of the resist mask 142. In such way, the gate metal 140 then can be removed selectively from such opening overlying the second active semiconductor region 103.

Figure 8:
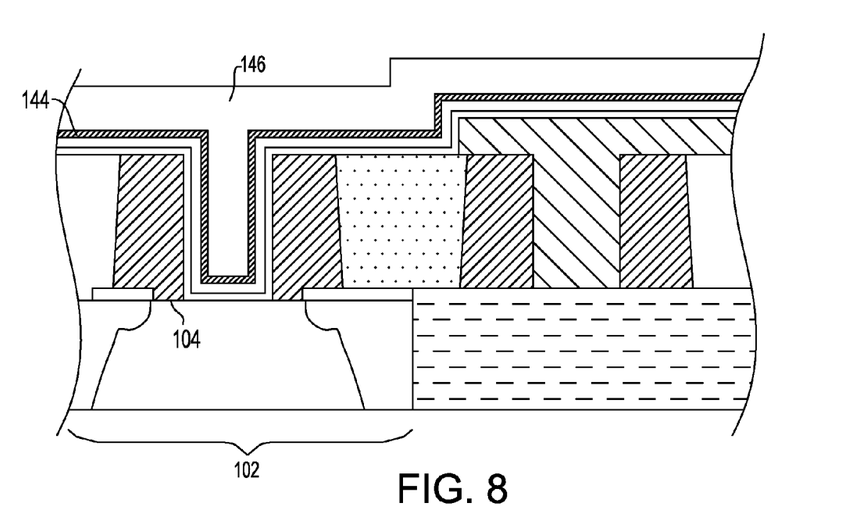
FIG. 8 is a sectional view illustrating a stage of fabrication subsequent to the stage shown in FIG. 7.

Thereafter, another gate metal 144 then can be deposited onto all exposed surfaces, resulting in the structure as seen in FIG. 8. During this process, the gate metal 144 can be deposited into the third opening (not shown) that overlies the second active semiconductor region 103 (FIG. 12) as a gate metal having a workfunction suitable for forming an NFET. Since the gate metal 140 is removed from the third opening (not shown) overlying the second active semiconductor region before depositing the second gate metal 144 therein, only the second gate metal 144 remains within such opening and is able to affect the workfunction of the gate formed therefrom. A further metal 146 such as aluminum then can be deposited to fill remaining volumes within the first and third openings which overlie the first and second active semiconductor regions 102, 103 (FIG. 12), respectively, resulting in the structure as seen in FIG. 8.

Figure 9:
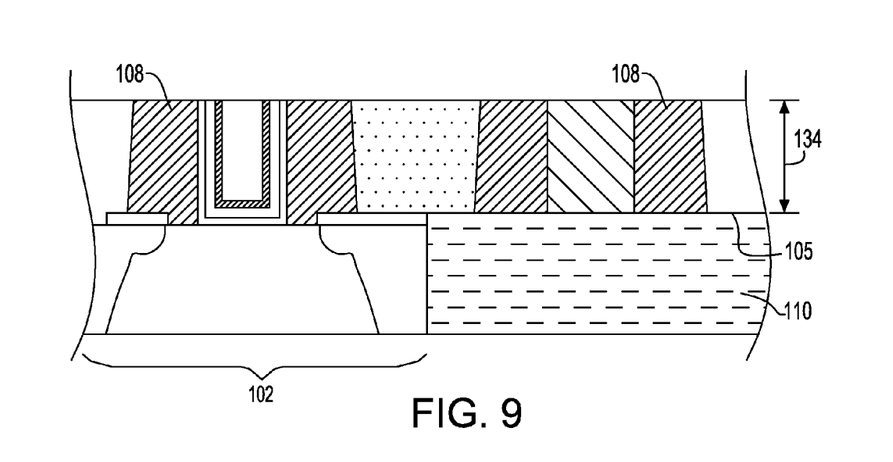
FIG. 9 is a sectional view illustrating a stage of fabrication subsequent to the stage shown in FIG. 8.

Thereafter, the structure can be subjected to a polishing process which removes materials above the spacers 108 overlying the active semiconductor region 102 and the isolation region 110. In one example, the polishing can be performed by CMP. The polishing operation thus can remove all materials above a stop level of the structure which can correspond approximately to a height 134 of the spacers 108 above the surface 105 of the isolation region 110 as seen in FIG. 9. This results in a structure in which the metals have been fully removed from locations other within the openings overlying the first and second active semiconductor regions and other than within the opening overlying the isolation region 110. As a result of the polishing process, the height 134 of the spacers 108 may be the same as or somewhat less than the spacer height 134 at the stage shown in FIG. 3.

Figure 10:
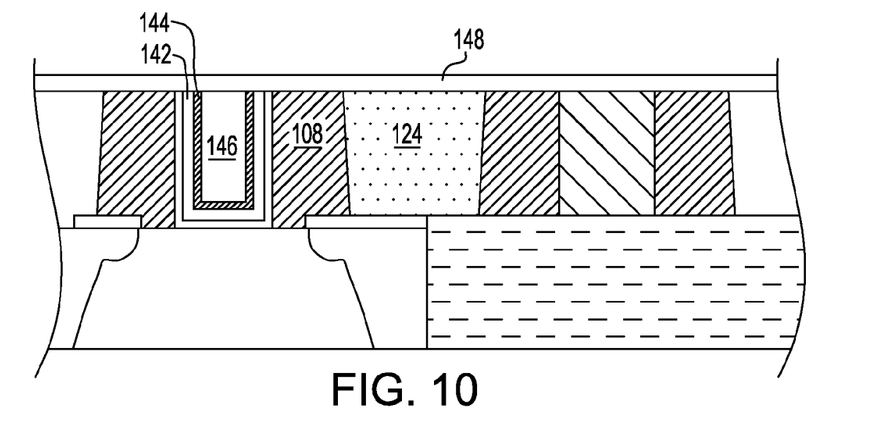
FIG. 10 is a sectional view illustrating a stage of fabrication subsequent to the stage shown in FIG. 9.

FIG. 10 illustrates a further stage of fabrication in which a capping layer 148 is formed covering exposed surfaces of the structure such that the capping layer seals therein the metal layers 142, 144, 146, the spacers 108 and the oxide region 124. In one example, the capping layer can consist essentially of silicon nitride such as to protect against out-diffusion from one or more of the metal layers 142, 144, 146 into oxide 124 or other structure which may include an oxide.

Figure 11:
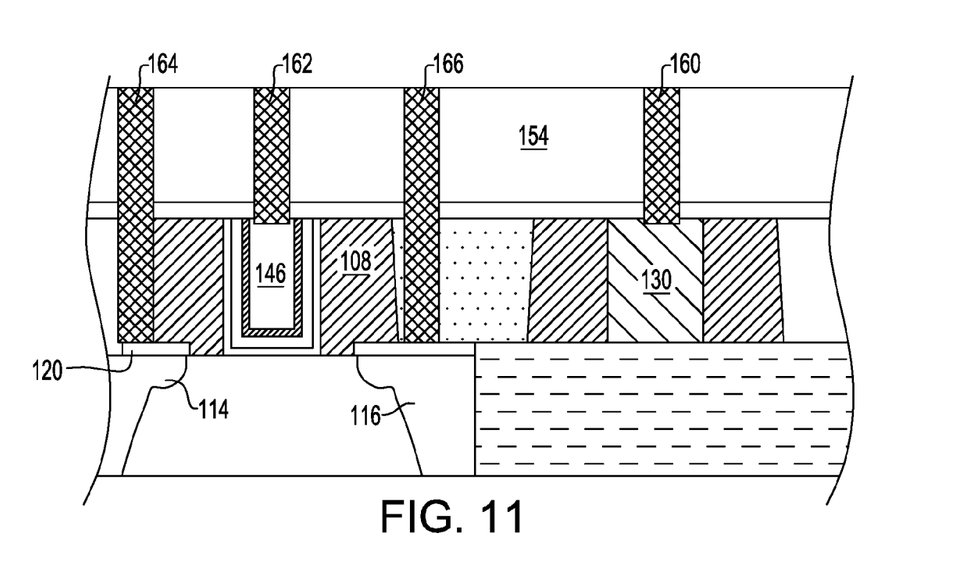
FIG. 11 is a sectional view illustrating a stage of fabrication subsequent to the stage shown in FIG. 9.

FIG. 11 illustrates a subsequent stage of fabrication in which a further dielectric region 154, e.g., an interlevel dielectric ("ILD") layer is formed atop the capping layer 148. Thereafter, conductive contacts 160, 162, 164 and 166 can be formed which extend through the dielectric region 154 to the fuse element defined by the remaining portion of the monolithic conductive region 130, as well as to the PFET and the NFET. Specifically, contacts 162 can extend to the gates of the PFET and the NFET formed by the metal layers 142, 144, 146, and contacts 164, 166 can extend to the sources and drains 114, 116 of the PFET and the NFET or to the silicide regions 120 aligned with the sources and the drains, respectively.

After forming the fuse element, PFET or NFET as described above, the semiconductor wafer can be severed into individual integrated circuits, e.g., semiconductor chips, which then can be packaged and electrically interconnected with further structure in an electronic system.

Figure 12:
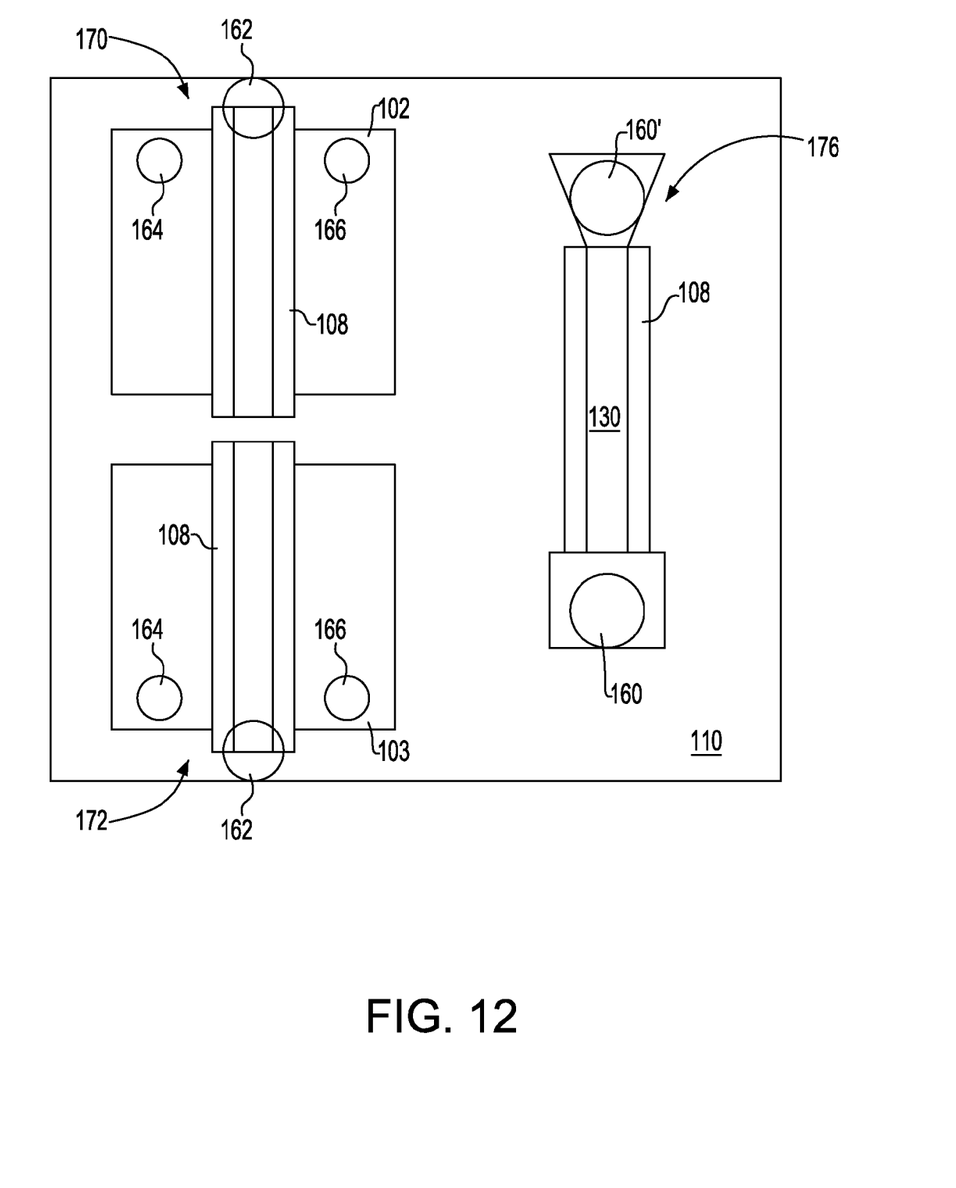
FIG. 12 is a plan view of a PFET, an NFET and an electrical fuse formed in accordance with an embodiment of the invention.

FIG. 12 shows a corresponding plan view of the PFET 170, the NFET 172, and the electrical fuse formed in accordance with the above-described process. Contacts 160, 160' are provided near ends of the electrical fuse 176, such as at locations spaced apart by a central region of the monolithic conductive region 130. Contacts 162 to the gates of the PFET 170 and NFET 172 are shown at locations overlying the isolation region 110. Contacts to the sources and drains of the transistors are shown at 164 and 166, respectively.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of fabricating an electrical fuse and a field effect transistor having a metal gate, comprising:
   (a) removing material from first and second openings in a dielectric region overlying a substrate, wherein the first opening is aligned with an active semiconductor region of the substrate, and the second opening is aligned with an isolation region of the substrate, the active semiconductor region including a source region and a drain region adjacent edges of the first opening; and
   (b) forming a fuse element filling the second opening, the fuse element having one or more layers of conductive material each being a metal or a conductive compound of a metal; and
   (c) after step (b), depositing one or more metal layers onto a dielectric layer overlying the active semiconductor region within the first opening, the one or more metal layers including a gate metal layer having a workfunction selected so as to function as a metal gate of a field effect transistor ("FET") including the metal gate and the active semiconductor region,
   wherein step (b) includes filling the first and second openings with the conductive material, then removing the conductive material from the first opening selectively relative to an interface layer overlying the active semiconductor region before performing step (c).

2. The method of claim 1, wherein step (a) includes removing the material simultaneously from the first and second openings.

3. The method of claim 1, further comprising forming a gate dielectric overlying the active semiconductor region after removing the conductive material from the first opening and prior to performing step (c).

4. The method as claimed in claim 3, wherein the forming of the gate dielectric includes repairing a dielectric layer exposed within the first opening.

5. The method as claimed in claim 3, wherein the forming of the gate dielectric results in a gate dielectric having a dielectric constant greater than five.

6. The method as claimed in claim 3, further comprising removing the interface layer exposed within the first opening before forming the gate dielectric.

7. The method as claimed in claim 1, wherein the conductive material is titanium nitride.

8. The method as claimed in claim 7, wherein step (b) includes forming the fuse element by depositing the titanium nitride by chemical vapor deposition.

9. The method of claim 1, further comprising, after performing steps (b) and (c), exposing a surface of the dielectric region and forming transistor contacts connected to the source, the drain, and the metal gate, and forming fuse contacts connected to spaced apart locations of the conductive material.

10. The method as claimed in claim 1, further comprising depositing at least one metal other than the first gate metal overlying the first gate metal layer within the first opening.

11. The method as claimed in claim 1, wherein the dielectric region includes dielectric spacers adjacent the first and second openings and a dielectric material filling a volume between the spacers.

12. The method as claimed in claim 11, wherein the dielectric spacers include spacers formed of silicon nitride and the dielectric material filling the volume includes silicon oxide.

13. The method as claimed in claim 1, wherein the active semiconductor region is a first active semiconductor region, step (a) further includes removing material from a third opening aligned with the second active semiconductor region, and a source and a drain are disposed in the second active semiconductor region adjacent respective edges of the third opening, the method further comprising the step of depositing a second gate metal layer within the third opening after performing step (b), the second gate metal layer having a second workfunction selected so as to function as a second metal gate of a second FET including the second metal gate and the second active semiconductor region.

14. The method as claimed in claim 13, wherein the first FET is a p-type FET ("PFET"), the second FET is an n-type FET ("NFET"), the first gate metal layer has a first workfunction corresponding to a p-type FET ("PFET") and the second gate metal layer has a second workfunction corresponding to an n-type FET ("NFET"), the second workfunction different from the first workfunction.

15. The method of claim 14, wherein step (b) further includes filling the third opening with the conductive material, and the removing the conductive material includes removing the conductive material from the third opening selectively relative to an interface layer overlying the second active semiconductor region before depositing the second gate metal layer.

16. A method of fabricating an electrical fuse and a field effect transistor having a metal gate, comprising:
(a) removing material from first and second openings in a dielectric region overlying a substrate, wherein the first opening is aligned with an active semiconductor region of the substrate, and the second opening is aligned with an isolation region of the substrate, the active semiconductor region including a source region and a drain region adjacent edges of the first opening;
(b) forming a fuse element filling the second opening, the fuse element having one or more layers of conductive material each being a metal or a conductive compound of a metal;
(c) after step (b), forming a gate dielectric in the first opening overlying the active semiconductor region; and
(d) after step (c), depositing a gate metal layer within the first opening, the gate metal layer having a workfunction selected so as to function as a metal gate of a field effect transistor ("FET") including the metal gate and the active semiconductor region,
wherein step (b) includes filling the first and second openings with the conductive material, and removing the conductive material from the first opening selectively relative to an interface layer overlying the active semiconductor region before performing step (c).

17. The method as claimed in claim 16, wherein in step (c) the forming of the gate dielectric includes repairing a dielectric layer exposed within the first opening.

18. The method as claimed in claim 16, further comprising, after step (b), removing an interface layer exposed within the first opening before forming the gate dielectric.

\* \* \* \* \*